United States Patent
Meyer et al.

(10) Patent No.: US 9,989,607 B2
(45) Date of Patent: Jun. 5, 2018

(54) METHOD AND MAGNETIC RESONANCE APPARATUS TO ACQUIRE MR DATA AND TO RECONSTRUCT AN MR IMAGE

(71) Applicant: Siemens Aktiengesellschaft, Munich (DE)

(72) Inventors: Esther Meyer, Erlangen (DE); Dominik Paul, Bubenreuth (DE)

(73) Assignee: Siemens Aktiengesellschaft, Munich (DE)

(*) Notice: Subject to any disclaimer, the term of this patent is extended or adjusted under 35 U.S.C. 154(b) by 994 days.

(21) Appl. No.: 14/332,442

(22) Filed: Jul. 16, 2014

(65) Prior Publication Data

US 2015/0022207 A1 Jan. 22, 2015

(30) Foreign Application Priority Data

Jul. 16, 2013 (DE) .......................... 10 2013 213 940

(51) Int. Cl.
*G01V 3/00* (2006.01)
*G01R 33/48* (2006.01)
*G01R 33/561* (2006.01)

(52) U.S. Cl.
CPC ...... *G01R 33/4818* (2013.01); *G01R 33/5617* (2013.01)

(58) Field of Classification Search
CPC .................................................. G01R 33/4818
See application file for complete search history.

(56) References Cited

U.S. PATENT DOCUMENTS

2008/0197842 A1 8/2008 Lustig et al.
2010/0237864 A1* 9/2010 Stemmer .............. G01R 33/246
324/309

(Continued)

OTHER PUBLICATIONS

Lustig et al: "Sparse MRI: The Application of Compressed Sensing for Rapid MR Imaging", Magnetic Resonance in Medicine 58; pp. 1182-1195, (2007).

(Continued)

*Primary Examiner* — Daniel Miller
(74) *Attorney, Agent, or Firm* — Schiff Hardin LLP

(57) ABSTRACT

In a method to operate a magnetic resonance (MR) system to acquire MR data, an RF excitation pulse is radiated followed by repeated, chronologically sequential implementation of the following steps in order to respectively acquire the MR data of an echo train. A refocusing pulse is radiated, a phase coding gradient is activated, and an additional magnetic field gradient for spatial coding is activated in a direction that is orthogonal to the direction of the phase coding gradient in order to read out the MR data of a k-space line. A k-space line in the k-space center is acquired at a predetermined echo time. A first half of k-space is acquired by entering data into k-space lines of the respective echo train, the data being acquired before the echo time. A second half of k-space is acquired by entering data into k-space lines of the respective echo train, this data having been acquired after the echo time. The k-space lines in the first half of k-space have a first density while the k-space lines in the second half of k-space have a second density that differs from the first density.

17 Claims, 4 Drawing Sheets

(56) References Cited

U.S. PATENT DOCUMENTS

2011/0241676 A1 10/2011 Busse et al.
2013/0310678 A1 11/2013 Balbi et al.

OTHER PUBLICATIONS

Donoho "Compressed sensing" IEEE Transactions on Information Theory IEEE USA, vol. 52, No. 4, Apr. (2006), pp. 1289-1306.
Candes et al: Robust uncertainty principles: exact signal reconstruction from highly incomplete frequency information, IEEE Transactions on Information Theory, vol. 52, No. 2, (2006), pp. 489-509.
Jung et al.; "Parallel Imaging With Asymmetric Acceleration to Reduce Gibbs Artifacts and to Increase Signal-To-Noise Ratio of the Gradient Echo Echo-Planer Imaging Sequence for Functional MRI"; Magnetic Resonance in Medicine; vol. 67 (2012); ; pp. 419-427.
Ferrara et al.;; "Resolution Optimization With Irregularly Sampled Forier Data"; Inverse Problems IOP Science; (2012) pp. 1-21.

* cited by examiner

METHOD AND MAGNETIC RESONANCE APPARATUS TO ACQUIRE MR DATA AND TO RECONSTRUCT AN MR IMAGE

BACKGROUND OF THE INVENTION

Field of the Invention

The present invention concerns a method and a magnetic resonance (MR) system in order to acquire MR data and in order to reconstruct an MR image by means of these MR data.

Description of the Prior Art

According to the prior art, it is known to use compressed sensing (compressed sampling) so as to undersample k-space (i.e. to acquire MR data by means of undersampling, and thus to not acquire (fill) all k-space points) and then, for example, to reconstruct an MR image based on the MR data using a compressed sensing reconstruction method. In this technique, k-space is thereby undersampled randomly (or in particular pseudorandomly), so the scanned k-space points or k-space lines have a uniform density or a density that is point-symmetrical relative to the k-space center.

In an acquisition of MR data using a turbo spin echo sequence or a SPACE sequence, multiple k-space lines are acquired in an echo train. A k-space line should be acquired at the k-space center at a predetermined echo time (time from the excitation pulse to the data acquisition) in order to achieve or generate the desired contrast in the MR image to be reconstructed.

SUMMARY OF THE INVENTION

An object of the present invention is to undersample k-space under consideration of the echo time condition as described above, but wherein fewer artifacts occur in a subsequent reconstruction of an MR image, in comparison to the prior art.

The method according to the present invention to acquire MR data by operation of a magnetic resonance system includes the following steps, which are implemented multiple times (i.e. for each echo train) in order to acquire k-space with multiple echo trains.

One RF excitation pulse is radiated for each echo train. The following, steps are executed in chronological succession, multiple times in the specified order, in order to execute an echo train. The count with which the following steps are executed multiple times is designated as an echo train length (or turbo factor). These steps are: radiate a refocusing pulse, activate a phase coding gradient or two phase coding gradients, activate an additional magnetic field gradient (known as a frequency coding gradient) in order to implement a spatial coding in a direction that is orthogonal to the direction of the phase coding gradient, or to the directions of the phase coding gradients, and read out MR data of a k-space line while this addition magnetic field gradient is activated.

Thus a refocusing pulse is radiated before each acquisition of an echo (readout of a k-space line) of the respective echo train. The number of echoes acquired for the respective echo train corresponds to the echo train length, with each echo (each k-space line) of the respective echo train being acquired with an individual phase coding gradient setting, i.e. with a phase coding step.

According to the invention, a k-space line in the k-space center is acquired at an echo time that is predetermined or provided (by the user, for example). This effective echo time, which thus defines the time period between the RF pulse and the scanning of the k-space in the k-space center, is shortened to "echo time" in the following.

Before this echo time, MR data within a first half of k-space are acquired with the use of the k-space lines or echoes of the respective echo train, while after this echo time MR data within a second half of k-space are acquired with k-space lines or echoes of the respective echo train.

According to the invention, the first half of k-space is scanned (filled with data) such that the acquired k-space lines have a first density. The second half of k-space is scanned such that the acquired k-space lines have a second density that differs from the first density.

One procedure to determine those k-space lines that are to be scanned respectively in the first or second half of k-space, is a (pseudo-)random distribution of the k-space lines corresponding to the first or second density. In other words: in this procedure the k-space lines are (pseudo-)randomly (not equidistantly) distributed both in the first k-space half and in the second k-space half.

Because the two halves of k-space have different densities according to the invention, in spite of an undersampling, the echo time condition can be complied with, meaning that the k-space center is scanned at the (effective) echo time. In spite of the undersampling, an MR image can be reconstructed which has fewer artifacts than is the case according to the prior art.

An incoherent scanning (i.e. a non-equidistant arrangement of k-space lines to be scanned) is an important requirement for the application of compressed sensing. For example, as described in "Robust uncertainty principles: Exact signal reconstruction from highly incomplete frequency information" by E. Candes et al., IEEE Transactions on Information Theory 2006, 52, Pages 489-509, or in "Compressed Sensing" by D. Donoho, IEEE Transactions on Information Theory 2006, 52, Pages 1289-1306, images can then be reconstructed particularly well from undersampled data if the sample points are selected randomly. This random undersampling (i.e. the random selection of the sample points) ensures an incoherency of the artifacts resulting from the undersampling, such that these appear like noise and can thereby be eliminated in a compressed sensing reconstruction.

The following variants exist for the first density and the second density: The first or, respectively, second density can be uniform or constant in its corresponding k-space half. The first or, respectively, second density can be dependent on the distance from the k-space center, such that the first or, respectively, second density is in particular greater the smaller the distance from the k-space center.

In other words, the first k-space half has a first probability density function and the second k-space half has a second probability density function. For each position at which a k-space line is acquired in a complete scan of k-space (i.e. without undersampling), the first and second probability density functions establish the probability with which a k-space line is acquired at the corresponding position, in the respective k-space half, in the case of the undersampling, and which is greater than 0 overall. This first and second probability density functions are constant in the first case described above and, in the second case described above, decrease with increasing distance of the respective position from the k-space center. The k-space center lies on the center axis in the center of k-space, this center axis being parallel to the k-space lines to be acquired.

In the case of a conventional complete scanning of k-space, every k-space line can actually be scanned. However, there are also approaches (for example elliptical scanning) in which it is the case that not every k-space line is acquired (filled with data) without an undersampling. The probability density function would assume a value of 0 at the position of a k-space line that is also not acquired without undersampling. However, if the probability density function is only related to those positions at which k-space lines are also acquired without undersampling in a scan of k-space, both the first and second probability density functions are overall greater than 0.

According to a preferred embodiment of the invention, a first minimum distance and a first maximum distance are provided for the first k-space half. Each k-space line to be scanned in the first half has a distance from its nearest likewise scanned k-space line, which distance is not smaller than the first minimum distance and is not greater than the first maximum distance. A second minimum distance and a second maximum distance are similarly predetermined for the second k-space half. Each k-space line to be scanned in the second half has a distance from its nearest likewise scanned k-space line, which distance is not smaller than the second minimum distance and is not greater than the second maximum distance.

By the specification of these minimum and maximum distances, the k-space lines to be acquired are determined pseudorandomly as before, wherein the scanning scheme (i.e. the selection of the k-space lines to be scanned) ensures an incoherent scanning as in the other embodiments.

It is possible for the first minimum distance, the first maximum distance, the second minimum distance and the second maximum distance to be constant for each position within the corresponding k-space half. Another possibility is for each of the first minimum distance, the first maximum distance, the second minimum distance and the second maximum distance to be greater, the greater the distance between the respective position of the k-space line being filled within the corresponding k-space half and the k-space center.

The embodiments according to the invention, in which the density or the probability density function, or the distances, are dependent on the distance from the k-space center, fall into the category of "variable density" schemes. For example, see "Sparse MRI: The application of compressed sensing for rapid MR imaging", by M. Lustig et al., Magn. Reson. Med., 58, 2007, Pages 1182-1195.

According to the invention, k-space is scanned both in the first half thereof and in its second half thereof so that nowhere is the density or probability density function 0 (with the exception of elliptical scanning). The invention ensures that the k-space line in the k-space center is scanned at the predetermined (effective) echo time, and that a uniform scanning of k-space takes place. The uniform scanning of k-space enables the use of iterative methods (for example compressed sensing) to reconstruct an MR image based on the acquired MR data, without a phase correction having to be implemented. In contrast to the prior art (in which algorithms based on partial Fourier or half-Fourier must be used for reconstruction), computing time can be saved and a result that is lower in artifacts can be achieved.

It is noted that, according to the invention, the condition that a k-space line in the k-space center is scanned at the (effective) echo time is considered to be satisfied if the k-space line scanned at the echo time from the respective echo train has the smallest distance from the k-space center among all k-space lines scanned from the respective echo train.

The invention enables a uniform acquisition of the MR data in k-space without signal jumps (discontinuities), such that no artifacts occur due to these signal jumps.

According to a further embodiment according to the invention, an undersampling factor is provided for the entirety of k-space. Depending on this undersampling factor, the first density or first probability density function and the second density or second probability density function are then determined such that the undersampling factor is complied with.

For this purpose, a first number $Anz_1$ of k-space lines (and thus echoes) in which data are entered in the first k-space half for the respective echo train is determined by the following Equation (1), using the echo time TE and a predetermined time interval $\Delta t$ between two successive echoes:

$$Anz_1 = TE/\Delta t. \quad (1)$$

The factor $\Delta t$ is known as an "echo spacing" and can be calculated using the resolution and the field of view, as well as using other parameters.

Using the following Equation (2), a second number $Anz_2$ of k-space lines (and thus echoes) in which are entered in the second k-space half for the respective echo train is then be determined using the echo train length EZL that is predetermined by the user and is constant for all echo trains:

$$Anz_2 = EZL - Anz_1 \quad (2)$$

A number of echo trains AEZ with which k-space is scanned according to the invention can be determined using the following Equation (3):

$$AEZ = UAF*AKRZ/EZL \quad (3)$$

wherein UAF is the undersampling factor, and AKRZ is the number of k-space lines that would be scanned given a complete scanning of k-space (without undersampling).

With knowledge of the echo trains AEZ, the first density $D_1$ and the second density $D_2$ can now be calculated via the following Equations (4) and (5):

$$D_1 = AEZ*Anz_1*2/AKZL \quad (4)$$

$$D_2 = AEZ*Anz_2*2/AKZL \quad (5)$$

This embodiment according to the invention enables both the detection of echo in the k-space center at the echo time, and compliance with a predetermined undersampling factor in the acquisition of the MR data, without needing to resort to approaches such as partial Fourier (or the like).

Through the asymmetrical adaptation of the density with which k-space is scanned, a k-space line in the k-space center can be scanned at the echo time without completely omitting larger regions of k-space.

A TSE ("Turbo Spin Echo") or SPACE ("Sampling Perfection with Application optimized Contrasts using different flip angle Evolutions") sequence can be used to acquire the MR data of the respective echo train.

The present invention can be used to acquire MR data of a slice as well as to acquire MR data of a three-dimensional volume segment.

In two-dimensional data acquisition (the acquisition of the MR data of a slice), only one phase coding gradient is required, the direction of which proceeds within the slice. The direction of the additional magnetic field gradient also proceeds within the slice and is orthogonal to the direction of the phase coding gradient. A two-dimensional data acquisition or an acquisition of MR data within a slice means that only one k-space point is scanned in the direction of the slice thickness.

Two phase coding gradients are required in three-dimensional data acquisition (the acquisition of the MR data of a three-dimensional volume segment). The directions of the two phase coding gradients and the direction of the additional magnetic field gradient are all orthogonal.

According to the invention, three variants exist for three-dimensional data acquisition. In one variant, k-space can be scanned using echo trains (k-space lines) proceeding in parallel with one another. In another variant, k-space can be scanned radially. In radial scanning, k-space is scanned using or along spokes that respectively proceed through the center axis in the center of k-space, each of these spokes representing to an echo train. Each echo train or each spoke proceeds orthogonal to this center axis, which itself proceeds along the direction of the additional magnetic field gradient. In another variant, the echo trains proceed in the shape of an ellipse, for example as is the case for elliptical scanning.

The scope of the present invention also encompasses a method for reconstruction of an MR image wherein, in this method, an MR image is reconstructed using MR data acquired with the method according to the invention for acquisition of MR data that is described above. The method according to the invention reconstructs the MR image from the MR data by compressed sensing (see for example "Sparse MRI: The application of compressed sensing for rapid MR imaging", by M. Lustig et al., Magn. Reson. Med., 58, 2007, Pages 1182-1195).

Given use of an iterative method such as compressed sensing, the invention makes it unnecessary to apply a phase correction algorithm, which conventionally must be used for reconstruction given algorithms based on partial/half-Fourier in order to at least reduce artifacts in the reconstructed image.

The scope of the present invention also encompasses a magnetic resonance apparatus for the acquisition of MR data. The magnetic resonance system has a basic field magnet, a gradient field system, one or more RF antennas, and a control device to control the gradient field system and the RF antenna(s), to receive the measurement signals that are acquired by the RF antenna(s), and to evaluate the measurement signals and generate the MR data. The control device operates magnetic resonance apparatus so as to radiate an RF excitation pulse to excite nuclear spins in a two-dimensional or three-dimensional volume segment of an examination subject, and repeatedly implements steps in chronological succession in order to acquire the MR data of an echo train by the repeated implementation of these steps: A refocusing pulse is radiated, one or two phase coding gradients is/are activated, and an additional magnetic field gradient for spatial coding is activated. The direction of the additional magnetic field gradient is orthogonal to the direction of the phase coding gradient or orthogonal to the directions of the two phase coding gradients. The magnetic resonance apparatus is operated to read out the MR data of a k-space line while the additional magnetic field gradient is activated.

For each echo train, the magnetic resonance apparatus is operated to read out a k-space line in the k-space center at a predetermined echo time. For each echo train, the magnetic resonance apparatus is operated to acquire the first half of k-space using k-space lines which are read out before the echo time. The magnetic resonance apparatus is operated to acquire the second half of k-space using k-space lines which are read out after the echo time. The first k-space half has a first density of scanned k-space lines and the second k-space half has a second density of scanned k-space lines, with the first density being different from the second density.

The advantages of the magnetic resonance apparatus according to the invention essentially correspond to the advantages of the method according to the invention that have been described in detail above.

The magnetic resonance apparatus according to the invention can also be operated to implement the method according to the invention for reconstruction of an MR image based on the MR data.

The present invention also encompasses a non-transitory, computer-readable data storage medium encoded with programming instructions that, when the storage medium is loaded into a computerized control and processing system of a magnetic resonance apparatus, caused the magnetic resonance apparatus to be operated in order to implement any or all of the embodiments of the method according to the invention described above.

The programming instructions can thereby be source code (C++, for example) that must still be compiled and linked or that only must be interpreted, or can be an executable software code that has only to be loaded into the corresponding computer for execution.

The electronically readable data medium can be a DVD, a magnetic tape or a USB stick electronically readable control information (see above) is stored.

The present invention is particularly suitable for reconstruction of MR images based on acquired MR data of a three-dimensional volume segment. Naturally, however, the present invention is not limited to this preferred field of application since the present invention can also be used to acquire MR data of a two-dimensional volume segment (of a slice), for example.

DESCRIPTION OF THE PREFERRED EMBODIMENTS

Figure 1:
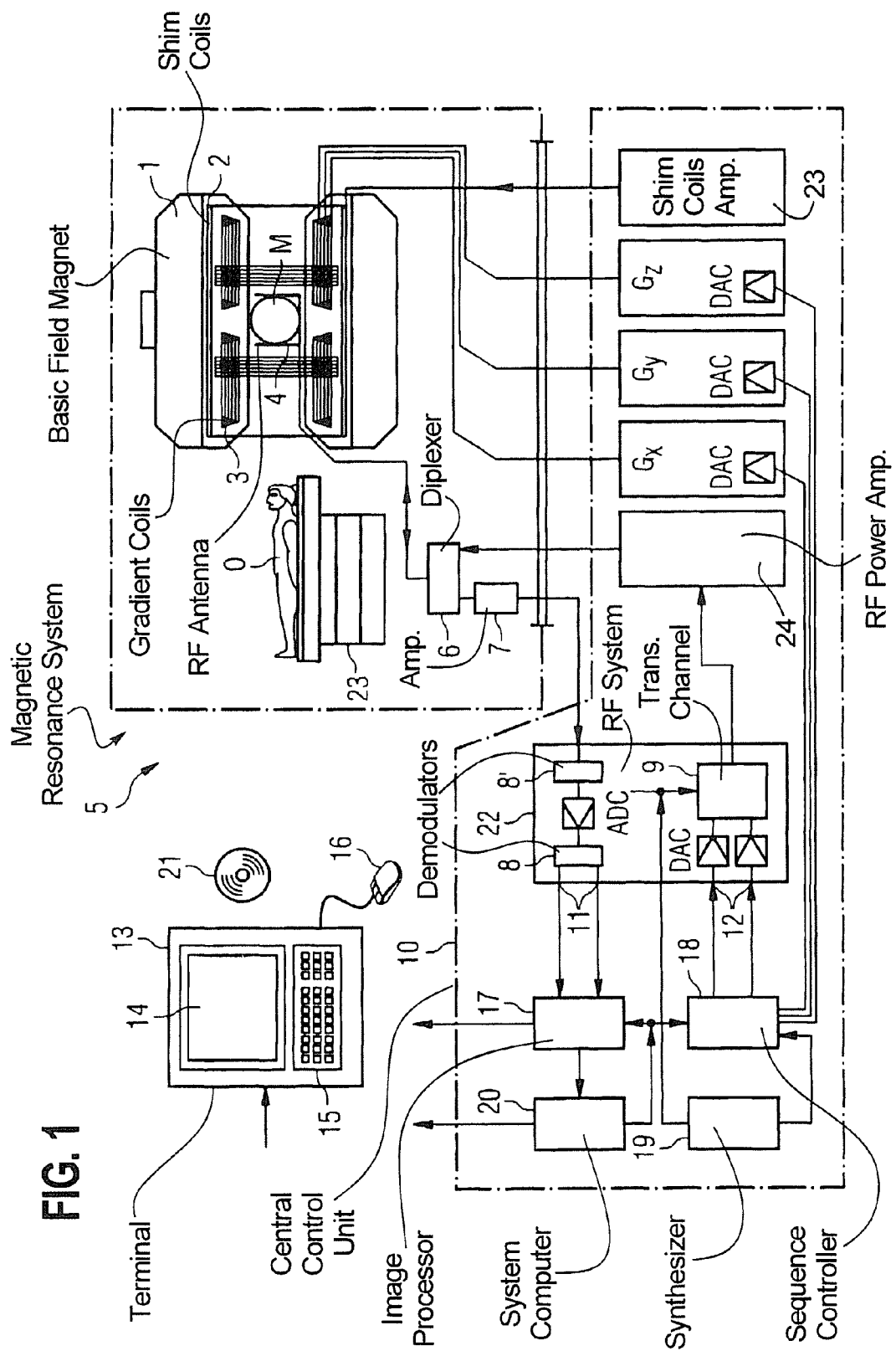
FIG. 1 depicts a magnetic resonance system according to the invention.

FIG. 1 is a schematic depiction of a magnetic resonance system 5 (a magnetic resonance imaging or magnetic resonance tomography apparatus). A basic field magnet 1 generates a temporally constant, strong magnetic field for polarization or, respectively, alignment of the nuclear spins in a volume segment of a subject O), for example of a part of a human body that is to be examined, which body (lying on a table 23) is examined in the magnetic resonance system 5. The high homogeneity of the basic magnetic field that is required for the nuclear magnetic resonance measurement is defined in a typically spherical measurement volume M in which the parts of the human body that are to be examined are arranged. Shim plates made of ferromagnetic material are attached at suitable points to support the homogeneity requirements, and in particular to eliminate temporally invariable influences. Temporally variable influences are eliminated by shim coils 2 that are operated by a shim coils amplifier 23.

A cylindrical gradient coil system 3, composed of three sub-windings, is situated in the basic field magnet 1. Each sub-winding is supplied with current by an amplifier to generate a linear (also temporally variable) gradient field in the respective direction of the Cartesian coordinate system. The first sub-winding of the gradient field system 3 generates a gradient G, in the x-direction; the second sub-winding generates a gradient $G_y$ in the y-direction; and the third sub-winding generates a gradient $G_z$ in the z-direction. Each amplifier has a digital/analog converter, which is activated by a sequence controller 18 for accurately-timed generation of gradient pulses.

One or more radio-frequency (RF) antennas 4 are situated within the gradient field system 3. These RF antennas 4 convert the radio-frequency pulses emitted by a radio-frequency power amplifier 24 into an alternating magnetic field for excitation of the nuclei and alignment of the nuclear spins of the subject O to be examined, or of the region of the subject O that is to be examined. Each radio-frequency antenna 4 is composed of one or more RF transmission coils and one or more RF reception coils in the form of an annular (advantageously linear or matrix-like) arrangement of component coils. The alternating field emanating from the precessing nuclear spins, i.e. normally the nuclear spin echo signals caused by a pulse sequence composed of one or more radio-frequency pulses and one or more gradient pulses, is also converted by the RF reception coils of the respective radio-frequency antenna into a voltage (measurement signal), which is supplied via an amplifier 7 to a radio-frequency reception channel 8 of a radio-frequency system 22. The radio-frequency system 22 (which is part of a control device 10 of the magnetic resonance system 5) furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12, and from the digital/analog converter to a transmission channel 9. In the transmission channel 9 the pulse sequences are modulated on a radio-frequency carrier signal having a base frequency that corresponds to the center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The acquired magnetic resonance signals are phase-sensitively demodulated to an intermediate frequency in the reception channel 8' (first demodulator) of the radio-frequency system 22, digitized in an analog/digital converter (ADC), and output via the output 11. This signal is further demodulated to a frequency of 0. The demodulation to a frequency of 0 and the separation into real part and imaginary part occurs in a second demodulator 8 after the digitization in the digital domain. An MR image or three-dimensional image data set is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. The sequence controller 18 thereby controls the accurately-timed switching (activation) of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of appropriate control programs (which are stored on a DVD 21, for example) to generate an MR image, and the presentation of the generated MR image, take place via a terminal 13 that has a keyboard 15, a mouse 16 and a monitor 14.

Figure 2:
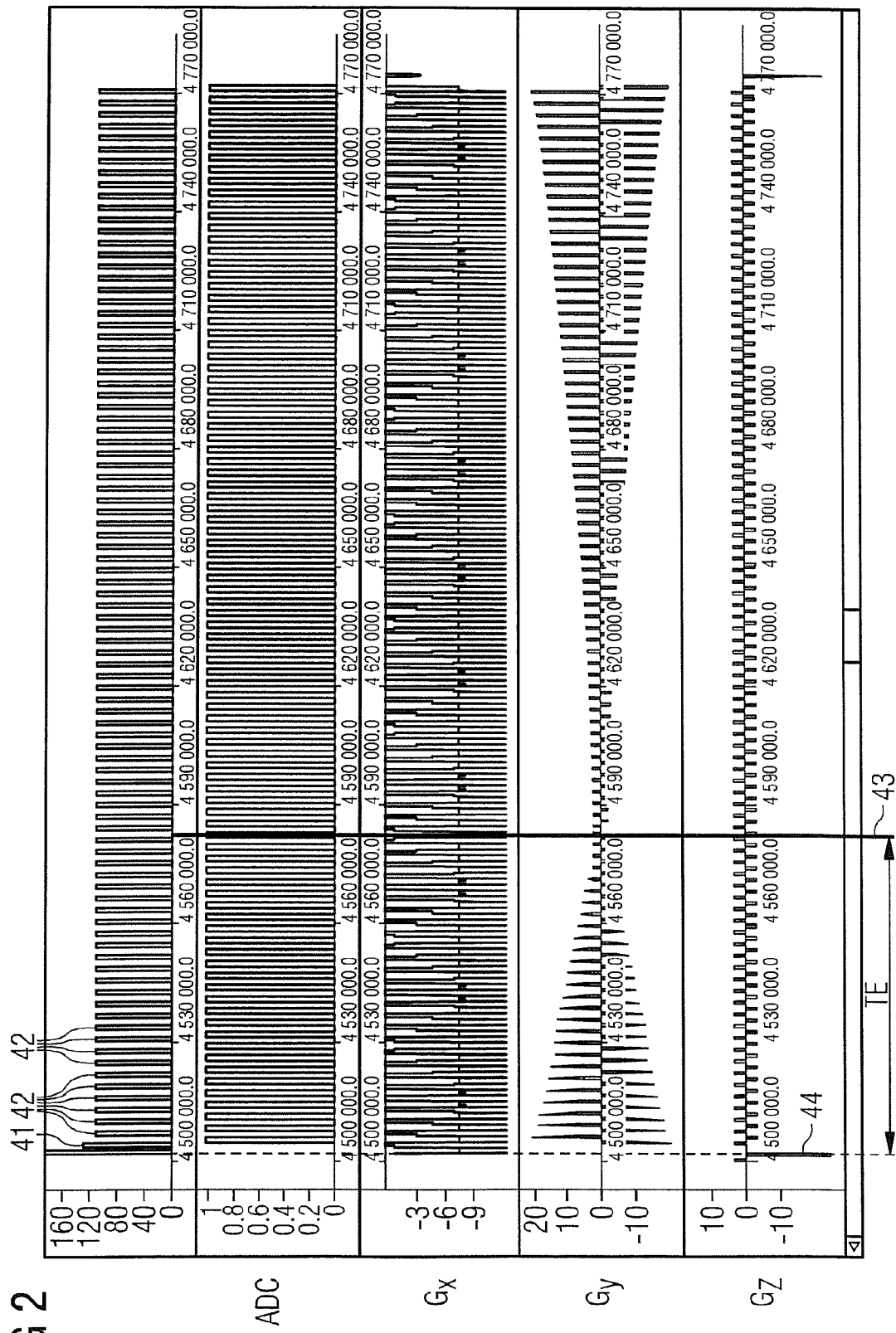
FIG. 2 shows a sequence according to the invention for the acquisition of MR data.

An exemplary pulse sequence according to the invention for scanning k-space with an echo train is depicted in FIG. 2. After a spoiler gradient 44 to obliterate "old" magnetization, an RF excitation pulse 41 is switched in order to excite the spins within the predetermined three-dimensional volume segment.

A refocusing pulse 42 is activated to read out a k-space line in the x-direction, following which are a gradient pulse $G_y$ in the y-direction and a gradient pulse $G_z$ in the z-direction. These two gradient pulses or phase coding gradients $G_y$, $G_z$ serve for the phase coding. After these two phase coding gradients $G_y$, $G_z$, a k-space line is read out, wherein a magnetic field gradient $G_x$ in the x-direction is switched in the meanwhile. ADC ("Analog/Digital Conversion") indicates in which time intervals the MR data are acquired and digitized.

It is apparent that the magnitude of the phase coding gradient $G_z$ remains constant over the entire echo train, while the magnitude of the phase coding gradient $G_y$ in this example begins with a maximum magnitude and decreases uniformly in identical steps up the point in time 43 in order to subsequently rise—again uniformly in identical steps—to the maximum magnitude. This means that the echo train runs in the y-direction. Since the slope with which the magnitude of the phase coding gradient $G_y$ decreases before the echo time TE is greater than the slope with which the magnitude of the phase coding gradient $G_y$ increases after the echo time TE, the spacing of the k-space lines is greater before the echo time TE than after the echo time TE.

After only a single radiation of the RF excitation pulse 41, given corresponding phase coding up to 250 non-selective refocusing pulses 42 (and therefore up to 250 k-space lines) can be read out. The shown sequence diagram can correspond to a SPACE sequence.

Figure 3:
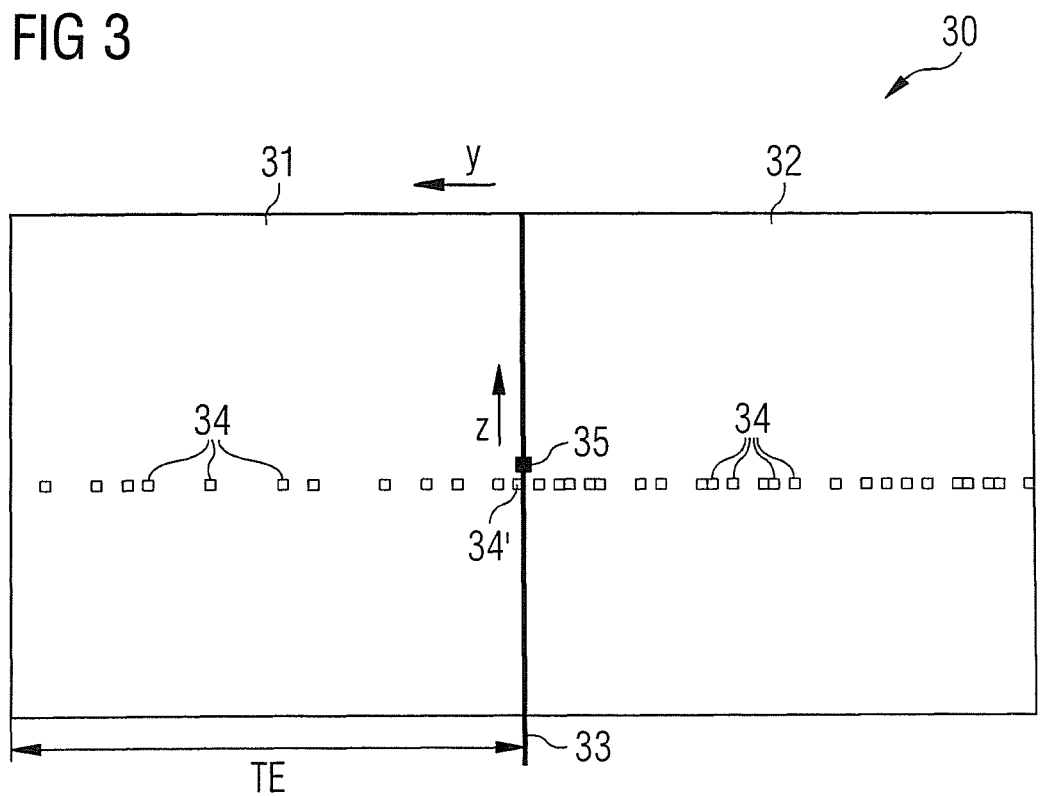
In FIG. 3 is an echo train in k-space according to the invention.

An echo train according to the invention is presented as an example in FIG. 3. Each point shown in FIG. 3 corresponds to a phase coding step or a k-space line 34 to be acquired. It is apparent that the number of k-space lines 34 to be acquired in the first half 31 of k-space 30 differs from the number of k-space lines 34 lying in the second half 32 of k-space 30. The density of the k-space lines 34 scanned in the first half 31 therefore also differs from the density of the k-space lines 34 scanned in the second half 32. The k-space line 34' in the k-space center 33 is scanned at the effective echo time TE. The k-space center 33 can be considered as a plane orthogonal to the y-direction which divides k-space 30 into two equally large halves 31, 32.

Since the density of the k-space lines 34 scanned in the first k-space half 31 is less than the density of the k-space lines 34 scanned in the second k-space half 32, the respective echo train acquires fewer k-space lines 34 in the first k-space half 31 than in the second k-space half 32.

To determine which k-space lines 34 are actually scanned, a first density or, respectively, first probability density function for the first (left) k-space half 31 and a second density or, respectively, second probability density function for the second (right) k-space half 32 are determined based on a predetermined undersampling factor, for example. For each k-space line, this probability density function establishes the probability with which the corresponding k-space line is actually scanned. With the exception of regions of k-space 30 which would not be scanned even given a complete scanning (without undersampling) of k-space (for example as is the case in elliptical scanning), the probability density function pdf(y, z) has a value d which lies between 0 and 1.

If the probability density function is constant in the first k-space half 31 and in the second k-space half 32, the probability density function pdf(y, z) results according to the following Equation (6)

$$pdf(y, z) = \begin{cases} d_1 \text{ for } y \leq 0 \\ d_2 \text{ for } y > \leq 0. \end{cases} \quad (6)$$

$d_1$ and $d_2$ is thereby greater than 0 and less than 1.

In contrast to this, if the probability density function is dependent on the distance from the k-space center 35 in both the first and second k-space half, the probability density function pdf(y, z) results according to the following Equation (7)

$$pdf(y, z) = \begin{cases} f_1\left(\sqrt{y*y+z} *z\right) \text{ for } y \leq 0 \\ f_2\left(\sqrt{y*y+z} *z\right) \text{ for } y > 0. \end{cases} \quad (7)$$

For the case that the probability density function in the first k-space half 31 or in the second k-space half 32 is not constant—for example as is the case in the embodiment (Relation (7)) described in the preceding—the (average) density of the respective k-space half 31, 32 can be determined as the integral of the probability density function over the corresponding k-space half.

Expressed in a different way, in the embodiment (Relation (7)) described in the preceding the function $f_1$ or, respectively, $f_2$ must be selected such that the integral of the function over the corresponding k-space half corresponds to the density of the respective k-space half determined via the sampling factor, for example.

Elliptical scanning can also be explained with the use of FIG. 3. In elliptical scanning, only the k-space lines within an ellipse are considered for scanning. Or, from another perspective, k-space lines which lie outside of the ellipse are certainly not scanned, and accordingly have a pdf(y, z)=0. The ellipse lies in the y-z plane, wherein the center point of the ellipse for the most part corresponds to the k-space center 35. The major axis advantageously lies in the direction of the y-axis.

Elliptical scanning is used in order to save measurement time in that the k-space lines at the corners are not acquired. This does in fact lead to a certain image blurriness in an image reconstruction, but this is tolerated in specific applications in which the savings of measurement time is more important.

Figure 4:
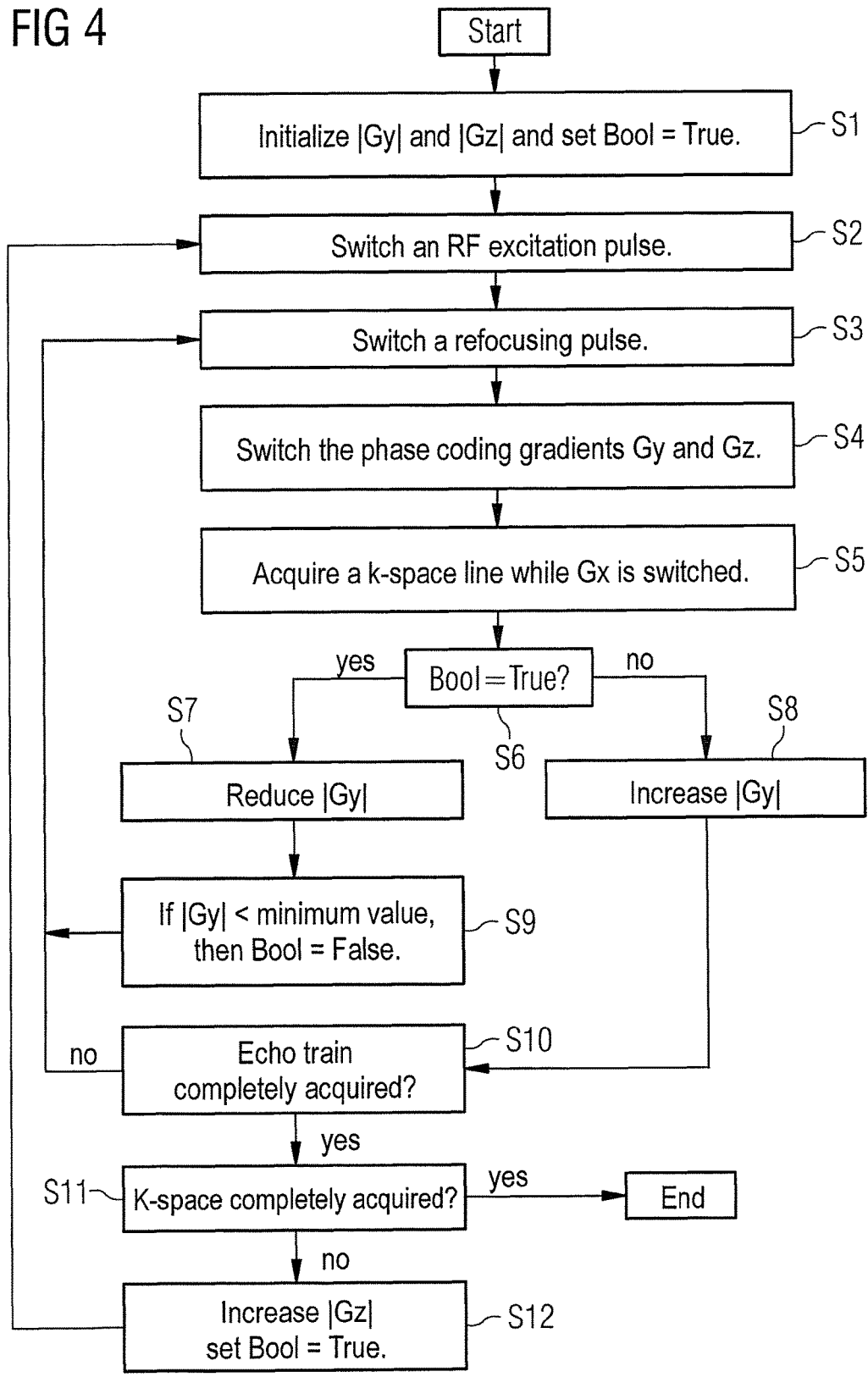
FIG. 4 is a flowchart according to the invention for the acquisition of MR data in a three-dimensional volume segment.

An exemplary flowchart regarding the scanning of k-space 30 according to the invention is shown in FIG. 4. This exemplary and grossly simplified flow chart should explain the present invention again from a different point of view.

In a first step S1, the magnitudes of the phase coding gradients $G_y$ and $G_z$ and an auxiliary variable Bool are initialized.

At the beginning of each echo train, an RF excitation pulse 41 is switched as is described in step S2. A refocusing pulse 42 is subsequently switched in step S3, and in step S4 the phase coding gradients $G_y$ and $G_z$ are switched according to their preset magnitudes. In the following step S5, a k-space line is acquired while the magnetic field gradient $G_x$ is activated.

Using the query in step S6 it is quasi-clarified whether the echo train is still located in the first k-space half 31 or is already in the second k-space half 32. If the auxiliary variable Bool has a value of "True", a k-space line 34 within the first k-space half 31 or at the k-space center 33 is scanned next. The magnitude of the phase coding gradient $G_y$ is therefore reduced in step S7.

Using the query in step S9 it is clarified whether the k-space line 34 at the k-space center 33 is scanned next. This is the case if the magnitude of the phase coding gradient $G_y$ is less than a minimum value which is selected to be small enough that only a phase coding gradient $G_y$ coding a k-space line in immediate proximity to the k-space center 33 satisfies the condition. In the event that the query implemented in step S9 returns an affirmative answer, the auxiliary variable Bool is modified to a value of "False". After step S9, the method returns to step S3.

Since the auxiliary variable now has a value of "False", the query S6 thus branches as of step S8, in which the magnitude of the phase coding gradient $G_y$ is increased. As long as the respective echo train has not yet been completely executed, the method returns to step S3 via step S10.

If it is detected in step S10 that the respective echo train has been completely acquired, in the following step S11 a check is made as to whether k-space has already been completely scanned. If this is not the case, in step S12 the other phase coding gradient $G_z$ is increased in order to prepare the execution of the next echo train. Moreover, the auxiliary value Bool is again set to a value of "True". The method now returns to step S2, in which the next echo train is executed. The method ends if it is established in step S11 that k-space has been completely acquired.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to acquire magnetic resonance (MR) data, comprising:
   operating an MR data acquisition unit to execute (1) and (2) below multiple times in order to acquire MR data and enter said MR data into a memory organized as k-space, comprising a plurality of k-space lines;
   (1) radiate a radio-frequency (RF) excitation pulse that excites nuclear spins in an examination subject and causes the excited nuclear spins to produce an echo train;
   (2) acquire signals, representing MR data, of said echo train by repeatedly and chronologically sequentially operating the MR data acquisition unit to (a) radiate a refocusing pulse, (b) activate a phase coding gradient, and (c) activate an additional magnetic field gradient that spatially encodes said signals in a direction that is orthogonal to a direction of said phase coding gradient and, during activation of said additional magnetic field gradient, reading out said signals and entering MR data corresponding to said signals into a respective line of k-space;

via a processor, controlling entry of the MR data into said memory organized as k-space by entering said MR data into respective lines of k-space, including entering MR data into a k-space line in a center of k-space at a predetermined echo time, entering MR data of a respective echo train acquired before said echo time into k-space lines of a first half of k-space, entering MR data of the respective echo train acquired after said echo time into k-space lines in a second half of k-space, said k-space lines in said first half of k-space having a first density and said k-space lines in said second half of k-space having a second density that is different from said first density; and making the MR data entered into said lines of k-space available in electronic form at an output of said processor.

2. A method as claimed in claim 1 comprising controlling said entry of said MR data into said memory organized as k-space by at least one of:
maintaining said first density constant within said first half of k-space, independent of a distance from said k-space center; or
maintaining said second density constant in said second half of k-space, independent of a distance from said k-space center.

3. A method as claimed in claim 1 comprising controlling said entry of said MR data into said memory organized as k-space by at least one of:
increasing said first density in said first half of k-space with decreasing distance from said k-space center; or
increasing said second density in said second half of k-space with decreasing density from said k-space center.

4. A method as claimed in claim 1 comprising controlling said entry of said MR data into said memory organized as k-space by at least one of:
predetermining a first minimum distance and a first maximum distance and entering said MR data into respective lines in k-space such that each k-space line in said first half into which MR data are entered has a distance from its nearest neighboring k-space line in said first half of k-space that is not less than said first minimum distance and not greater than said first maximum distance; or
predetermining a second minimum distance and a second maximum distance and entering said MR data into respective lines in k-space such that each k-space line in said second half into which MR data are entered has a distance from its nearest neighboring k-space line in said second half of k-space that is not less than said second minimum distance and not greater than said second maximum distance.

5. A method as claimed in claim 4 comprising controlling said entry of said MR data into said memory organized as k-space by maintaining said first minimum distance and said first maximum distant constant, independent of a distance in said first half of k-space from said k-space center, and maintaining said second minimum distance and said second maximum distance constant in said second half of k-space, independent of a distance from said k-space center.

6. A method as claimed in claim 4 comprising controlling said entry of said MR data into said memory organized as k-space by making said first minimum distance and said first maximum distance greater the greater a distance of a respective k-space line from said k-space center, and making said second minimum distance and said second maximum distance greater the greater a distance in said second half of k-space of the respective k-space line from the k-space center.

7. A method as claimed in claim 1 comprising controlling entry of said MR data into said memory organized as k-space with an undersampling factor that is predetermined for an entirety of k-space, and determining said first density and said second density dependent on said undersampling factor so that said MR data are entered into each of said first half of k-space and said second half of k-space in compliance with said undersampling factor.

8. A method as claimed in claim 7 comprising controlling said entry of said MR data into said memory organized as k-space according to the following criteria that are set by said control unit:
a first number of k-space lines in which MR data are entered in the first half of k-space for a respective echo train is a quotient of the echo time divided by a minimum echo spacing between data entry points in time of two successive k-space lines; a second number Anz2 of k-space lines is a difference of an echo train length EZL minus the first number;
a number of echo trains AEZ with which said MR data are entered into k-space is $$AEZ=UAF*AKRZ/EZL,$$

wherein UAF is the predetermined undersampling factor, and AKRZ corresponds to a number of k-space lines for a complete filling of k-space;
the first density D1 is $$D1=AEZ*Anz1*2/AKZL;\text{ and}$$

the second density D2 is $$D2=AEZ*Anz2*2/AKZL,$$

wherein Anz1 corresponds to the first number of k-space lines and Anz2 corresponds to the second number of k-space lines.

9. A method as claimed in claim 1 comprising operating said MR data acquisition unit to acquire said MR data of the respective echo train using a turbo spin echo sequence or a SPACE sequence.

10. A method as claimed in claim 1 comprising acquiring said MR data from a slice of the subject wherein the direction of the phase coding gradient and the direction of the additional magnetic field gradient both lie within said slice.

11. A method as claimed in claim 1 comprising acquiring said MR data from a three-dimensional volume segment of said subject, and operating said MR data acquisition unit to activate an additional phase coding gradient to acquire the MR data of a respective echo train, said additional phase coding gradient having a direction that is orthogonal to the direction of the phase coding gradient and to the direction of the additional magnetic field gradient.

12. A method as claimed in claim 11 comprising controlling entry of said MR data into said memory organized as k-space along a trajectory selected from the group consisting of a trajectory proceeding through a plurality of k-space lines that are parallel to each other in k-space, a trajectory of k-space lines that proceed radially in k-space with each k-space line proceeding through a center of k-space as a spoke, with all of said k-space lines being orthogonal to a center axis proceeding through k-space along the direction of the additional magnetic field gradient, and an elliptical trajectory.

13. A method to acquire magnetic resonance (MR) data, comprising:
- operating an MR data acquisition unit to execute (1) and (2) below multiple times in order to acquire MR data and enter said MR data into a memory organized as k-space, comprising a plurality of k-space lines;
- (1) radiate a radio-frequency (RF) excitation pulse that excites nuclear spins in an examination subject and causes the excited nuclear spins to produce an echo train;
- (2) acquire signals, representing MR data, of said echo train by repeatedly and chronologically sequentially operating the MR data acquisition unit to (a) radiate a refocusing pulse, (b) activate a phase coding gradient, and (c) activate an additional magnetic field gradient that spatially encodes said signals in a direction that is orthogonal to a direction of said phase coding gradient and, during activation of said additional magnetic field gradient, reading out said signals and entering MR data corresponding to said signals into a respective line of k-space;
- via a processor, controlling entry of the MR data into said memory organized as k-space by entering said MR data into respective lines of k-space, including entering MR data into a k-space line in a center of k-space at a predetermined echo time, entering MR data of a respective echo train acquired before said echo time into k-space lines of a first half of k-space, entering MR data of the respective echo train acquired after said echo time into k-space lines in a second half of k-space, said k-space lines in said first half of k-space having a first density and said k-space lines in said second half of k-space having a second density that is different from said first density;
- in said processor, reconstructing an MR image from said MR data in said memory organized as k-space, using a compressed sensing reconstruction algorithm; and
- making the MR image available in electronic form at an output of said processor.

14. A magnetic resonance (MR) apparatus, comprising:
- an MR data acquisition unit;
- a control unit configured to operate the MR data acquisition unit to execute (1) and (2) below multiple times in order to acquire MR data and enter said MR data into a memory organized as k-space, comprising a plurality of k-space lines;
- (1) radiate a radio-frequency (RF) excitation pulse that excites nuclear spins in an examination subject and causes the excited nuclear spins to produce an echo train;
- (2) acquire signals, representing MR data, of said echo train by repeatedly and chronologically sequentially operating the MR data acquisition unit to (a) radiate a refocusing pulse, (b) activate a phase coding gradient, and (c) activate an additional magnetic field gradient that spatially encodes said signals in a direction that is orthogonal to a direction of said phase coding gradient and, during activation of said additional magnetic field gradient, reading out said signals and entering MR data corresponding to said signals into a respective line of k-space;
- said control unit being configured to control entry of the MR data into said memory organized as k-space by entering said MR data into respective lines of k-space, including entering MR data into a k-space line in a center of k-space at a predetermined echo time, entering MR data of a respective echo train acquired before said echo time into k-space lines of a first half of k-space, entering MR data of the respective echo train acquired after said echo time into k-space lines in a second half of k-space, said k-space lines in said first half of k-space having a first density and said k-space lines in said second half of k-space having a second density that is different from said first density; and
- said control unit being configured to make the MR data entered into said lines of k-space available in electronic form at an output of said control unit.

15. A magnetic resonance apparatus, comprising:
- an MR data acquisition unit;
- a control unit configured to operate the MR data acquisition unit to execute (1) and (2) below multiple times in order to acquire MR data and enter said MR data into a memory organized as k-space, comprising a plurality of k-space lines;
- (1) radiate a radio-frequency (RF) excitation pulse that excites nuclear spins in an examination subject and causes the excited nuclear spins to produce an echo train;
- (2) acquire signals, representing MR data, of said echo train by repeatedly and chronologically sequentially operating the MR data acquisition unit to (a) radiate a refocusing pulse, (b) activate a phase coding gradient, and (c) activate an additional magnetic field gradient that spatially encodes said signals in a direction that is orthogonal to a direction of said phase coding gradient and, during activation of said additional magnetic field gradient, reading out said signals and entering MR data corresponding to said signals into a respective line of k-space;
- said control unit being configured to control entry of the MR data into said memory organized as k-space by entering said MR data into respective lines of k-space, including entering MR data into a k-space line in a center of k-space at a predetermined echo time, entering MR data of a respective echo train acquired before said echo time into k-space lines of a first half of k-space, entering MR data of the respective echo train acquired after said echo time into k-space lines in a second half of k-space, said k-space lines in said first half of k-space having a first density and said k-space lines in said second half of k-space having a second density that is different from said first density;
- a processor configured to reconstructing an MR image from said MR data in said memory organized as k-space, using a compressed sensing reconstruction algorithm; and
- said processor being configured to make the MR data entered into said lines of k-space available in electronic form at an output of said processor.

16. A non-transitory, computer-readable data storage medium encoded with programming instructions, said storage medium being loaded into a control and processing system of a magnetic resonance (MR) apparatus that comprises an MR data acquisition unit, said programming instructions causing said control and processing system to:
- operate the MR data acquisition unit to execute (1) and (2) below multiple times in order to acquire MR data and enter said MR data into a memory organized as k-space, comprising a plurality of k-space lines;
- (1) radiate a radio-frequency (RF) excitation pulse that excites nuclear spins in an examination subject and causes the excited nuclear spins to produce an echo train;

(2) acquire signals, representing MR data, of said echo train by repeatedly and chronologically sequentially operating the MR data acquisition unit to (a) radiate a refocusing pulse, (b) activate a phase coding gradient, and (c) activate an additional magnetic field gradient that spatially encodes said signals in a direction that is orthogonal to a direction of said phase coding gradient and, during activation of said additional magnetic field gradient, reading out said signals and entering MR data corresponding to said signals into a respective line of k-space;

control entry of the MR data into said memory organized as k-space by entering said MR data into respective lines of k-space, including entering MR data into a k-space line in a center of k-space at a predetermined echo time, entering MR data of a respective echo train acquired before said echo time into k-space lines of a first half of k-space, entering MR data of the respective echo train acquired after said echo time into k-space lines in a second half of k-space, said k-space lines in said first half of k-space having a first density and said k-space lines in said second half of k-space having a second density that is different from said first density; and make the MR data entered into said lines of k-space available in electronic form at an output of said control and processing system.

17. A non-transitory, computer-readable data storage medium encoded with programming instructions, said storage medium being loaded into a control and processing system of a magnetic resonance (MR) apparatus that comprises an MR data acquisition unit, said programming instructions causing said control and processing system to:

operate the MR data acquisition unit to execute (1) and (2) below multiple times in order to acquire MR data and enter said MR data into a memory organized as k-space, comprising a plurality of k-space lines;

(1) radiate a radio-frequency (RF) excitation pulse that excites nuclear spins in an examination subject and causes the excited nuclear spins to produce an echo train;

(2) acquire signals, representing MR data, of said echo train by repeatedly and chronologically sequentially operating the MR data acquisition unit to (a) radiate a refocusing pulse, (b) activate a phase coding gradient, and (c) activate an additional magnetic field gradient that spatially encodes said signals in a direction that is orthogonal to a direction of said phase coding gradient and, during activation of said additional magnetic field gradient, reading out said signals and entering MR data corresponding to said signals into a respective line of k-space;

control entry of the MR data into said memory organized as k-space by entering said MR data into respective lines of k-space, including entering MR data into a k-space line in a center of k-space at a predetermined echo time, entering MR data of a respective echo train acquired before said echo time into k-space lines of a first half of k-space, entering MR data of the respective echo train acquired after said echo time into k-space lines in a second half of k-space, said k-space lines in said first half of k-space having a first density and said k-space lines in said second half of k-space having a second density that is different from said first density;

reconstruct an MR image from said MR data in said memory organized as k-space, using a compressed sensing reconstruction algorithm; and make the MR image available in electronic form at an output of said control and processing system.

* * * * *